(12) United States Patent
Fukada (10) Patent No.: US 7,235,834 B2
(45) Date of Patent: Jun. 26, 2007

(54) FERROELECTRIC MEMORY AND ITS MANUFACTURING METHOD

(75) Inventor: Shinichi Fukada, Tokyo-to (JP)

(73) Assignee: Seiko Epson Corporation, Tokyo (JP)

( * ) Notice: Subject to any disclaimer, the term of this patent is extended or adjusted under 35 U.S.C. 154(b) by 140 days.

(21) Appl. No.: 11/200,017

(22) Filed: Aug. 10, 2005

(65) Prior Publication Data

US 2006/0043446 A1 Mar. 2, 2006

(30) Foreign Application Priority Data

Sep. 2, 2004 (JP) ............................. 2004-256043

(51) Int. Cl.
*H01L 29/76* (2006.01)
(52) U.S. Cl. ......................... 257/295; 257/296; 438/3
(58) Field of Classification Search ................. 257/295, 257/296, 310, 311, 298, 303, 306, 308, 532, 257/535; 438/3, 396; 365/145, 65, 149
See application file for complete search history.

(56) References Cited

U.S. PATENT DOCUMENTS 6,246,082 B1 * 6/2001 Mitarai et al. ............... 257/295

6,586,790 B2 * 7/2003 Kanaya et al. ............... 257/295

FOREIGN PATENT DOCUMENTS

JP A 11-135736 5/1999
JP A 2003-174145 6/2003

OTHER PUBLICATIONS

IMFEDK, Session F: Reliability Physics and Quality, 2003, p. 88, no month.

* cited by examiner

*Primary Examiner*—Jayprakash Gandhi
*Assistant Examiner*—Paul E Patton
(74) *Attorney, Agent, or Firm*—Oliff & Berridge, PLC (57) ABSTRACT

To securely prevent hydrogen from entering a ferroelectric layer of a ferroelectric memory. A first hydrogen barrier layer 5 is formed on the lower side of ferroelectric capacitors 7. Upper surfaces and side surfaces of the ferroelectric capacitors 7 are covered by a second hydrogen barrier layer. All upper electrodes 7c of the plural ferroelectric capacitors 7 to be connected to a common plate line P are connected to one another by an upper wiring layer 91. The upper wiring layer 91 is connected to the plate line P through a lower wiring 32 provided below the ferroelectric capacitors 7. A third hydrogen barrier layer 92 is formed on the upper wiring layer 91 such that all edge sections 92a of the third hydrogen barrier layer 92 come in contact with the first hydrogen barrier layer 5.

5 Claims, 5 Drawing Sheets

FERROELECTRIC MEMORY AND ITS MANUFACTURING METHOD

This application claims the benefit of Japanese Patent Application No. 2004-256043, filed Sep. 2, 2004. The entire disclosure of the prior application is hereby incorporated by reference herein in its entirety.

BACKGROUND

The present invention relates to ferroelectric memories and methods for manufacturing the same.

Ferroelectric memories (FRAMs: ferroelectric random access memories) provided with a ferroelectric layer as a dielectric layer of a capacitor are being developed in recent years. Ferroelectric has a characteristic in that polarization occurring upon application of a voltage remains even after the voltage application is stopped, and the remanence is retained for several ten years. Also, ferroelectric has a characteristic in that its polarization occur in a very short time of several ns, and the orientation of polarization changes by application of an electric field. Accordingly, a ferroelectric memory is a nonvolatile memory having a high data retention characteristic, such that write and readout operations to capacitors can be executed at high speed.

As a ferroelectric memory structure, a "stacked type" in which a source/drain region of a transistor and a lower electrode of a capacitor are directly connected to each other by a contact plug is known. A stacked type ferroelectric memory is effective in view of the fact that its cell area can be made small. In a conventional stacked type ferroelectric memory, contact plugs for connection with plate lines are formed on upper electrodes of capacitors. Tungsten that is low in resistance is suitable as a material for these contact plugs. A CVD method, in which the reaction is caused with tungsten fluoride and hydrogen as materials, is generally practiced as a method for forming tungsten plugs.

Also, PZT (Pb $(Zr_xTi_{(1-x)})O_3$), SBT ($SrBi_2Ta_2O_9$) and the like are known as materials of ferroelectric layers. However, these materials would likely be reduced by hydrogen, and their polarization characteristics lower when they are reduced. When the polarization characteristics of ferroelectric layers lower, the characteristics of ferroelectric memories deteriorate. Therefore it is necessary to prevent hydrogen from entering ferroelectric layers. For this reason, conventionally, it has been proposed to cover side surfaces and upper surfaces (upper surfaces of upper electrodes) of ferroelectric capacitors by a dielectric hydrogen barrier layer.

However, the step of forming tungsten plugs on the upper electrodes of the ferroelectric capacitors needs to be conducted in a state in which contact holes are opened in the hydrogen barrier layer provided on the upper surfaces of the upper electrodes, and the upper electrodes are therefore exposed. For this reason, even when the side surfaces and upper surfaces (upper surface of each upper electrode) of the ferroelectric capacitors are covered by a dielectric hydrogen barrier layer, the upper electrodes are exposed to hydrogen in this step, and penetration of hydrogen to the ferroelectric layers cannot be securely prevented.

Patent Document 1 below proposes a method to prevent penetration of hydrogen in ferroelectric layers of a stacked type ferroelectric memory, wherein a conductive hydrogen barrier layer is provided between a lower electrode of a ferroelectric capacitor and a contact plug, an upper electrode of each of plural capacitors (arranged in a word line direction) that are connected to a common plate line and the ferroelectric layer are commonly formed (patterning is not conducted after formation of a thin film), a gap between adjacent ones of the lower electrodes is embedded with a dielectric hydrogen barrier layer, and a common dielectric hydrogen barrier layer is also formed on the upper electrode.

[Patent Document 1] Japanese Laid-Open Patent Application 2003-174145

However, in the method described in the above Patent Document 1, because upper electrodes of plural capacitors (arranged in a word line direction) that are connected to a common plate line and ferroelectric layers are commonly formed, there is a problem in that parasitic capacitance is generated between the plural ferroelectric capacitors.

It is an object of the present invention to securely prevent penetration of hydrogen into a ferroelectric layer of a ferroelectric memory by a method in which parasitic capacitance is difficult to be generated among plural ferroelectric capacitors, compared to the method described in the above Patent Document 1.

SUMMARY

To solve the problems described above, the present invention pertains to a stacked type ferroelectric memory having a plurality of ferroelectric capacitors and transistors connected thereto, wherein lower electrodes of the ferroelectric capacitors and source/drain regions of the corresponding transistors are directly connected to one another by contact plugs, respectively, and the ferroelectric memory is characterized in that: a first hydrogen barrier layer is formed below the lower electrodes of the plurality of ferroelectric capacitors, and a second hydrogen barrier layer covers upper surfaces and side surfaces of the plurality of ferroelectric capacitors; all upper electrodes of a plurality of the ferroelectric capacitors connected to a common plate line are connected by an upper wiring layer formed above the second hydrogen barrier layer; a third hydrogen barrier layer is formed on the upper wiring layer to surround the second hydrogen barrier layer; all ends of the third hydrogen barrier layer contact the first hydrogen barrier layer; and the upper wiring layer and the plate line are connected through a lower wiring provided at a dielectric layer on a lower side of the first hydrogen barrier layer.

According to the ferroelectric memory of the present invention, the lower electrode side of the ferroelectric capacitor is protected by the first hydrogen barrier layer, the side surfaces of the ferroelectric capacitor are protected by the second hydrogen barrier layer, the upper electrode side of the ferroelectric capacitor is protected by the second hydrogen barrier layer and the third hydrogen barrier layer, and the end sections of the third hydrogen barrier layer are all in contact with the first hydrogen barrier layer, such that introduction of hydrogen into the ferroelectric layer of the ferroelectric capacitor can be securely prevented.

The present invention also pertains to a method for manufacturing a stacked type ferroelectric memory having a plurality of ferroelectric capacitors and transistors connected thereto, wherein lower electrodes of the ferroelectric capacitors and source/drain regions of the corresponding transistors are directly connected by contact plug, respectively, and the method for manufacturing a ferroelectric memory is characterized in comprising: a step of forming a first hydrogen barrier layer at a position on a lower side of lower electrodes of the plurality of ferroelectric capacitors; a step of laminating and then patterning a lower electrode thin film, a ferroelectric thin film and an upper electrode thin film, thereby forming ferroelectric capacitors formed from lower electrodes, ferroelectric layers and upper electrodes on the contact plugs, respectively; a step of covering upper surfaces and side surfaces of the plurality of ferroelectric capacitors formed in the previous step with a second hydrogen barrier layer; a step of forming a lower wiring for connecting an upper electrode layer that connects all upper electrodes of a plurality of the ferroelectric capacitors to be connected to a common plate line and the plate line at a dielectric layer formed at a position on a lower side of the first hydrogen barrier layer; a step of forming the upper wiring layer to be connected to the upper electrodes and predetermined portions of the lower wiring on the second hydrogen barrier layer; a step of forming a third hydrogen barrier layer on the upper wiring layer to surround the second hydrogen barrier layer, and to bring all ends of the third hydrogen barrier layer to be in contact with the first hydrogen barrier layer; and a step of forming the plate line on the contact plugs.

It is noted that the predetermined portions of the lower wiring are portions that do not overlap the position below the plate line.

According to the method for manufacturing a ferroelectric memory of the present invention, all of the upper electrodes of a plurality of the ferroelectric capacitors to be connected to a common plate line are connected by the upper wiring layer, and the upper wiring layer is connected to the plate line through the lower wiring provided on the lower side of the ferroelectric capacitor. For this reason, the upper electrodes would not be exposed and would not come in contact with a hydrogen atmosphere. In other words, the step of forming tungsten plugs on the upper electrodes of the ferroelectric capacitors becomes unnecessary, such that hydrogen is securely prevented from entering the ferroelectric layer of the ferroelectric capacitor.

Also, because the third hydrogen barrier layer is formed on the upper wiring layer so that all of the end sections thereof are brought in contact with the first hydrogen barrier layer, hydrogen is securely prevented from entering the ferroelectric layer of the ferroelectric capacitor.

Furthermore, according to the method for manufacturing a ferroelectric memory of the present invention, the ferroelectric capacitor is formed on each of the contact plugs by laminating a lower electrode thin film, a ferroelectric thin film and an upper electrode thin film and then patterning them. Therefore, parasitic capacitance is difficult to be generated among plural ferroelectric capacitors connected to a common plate line, compared to the method described in the above Patent Document 1 (the method in which upper electrodes of plural ferroelectric capacitors connected to a common plate line and ferroelectric layers are commonly formed).

In the method for manufacturing a ferroelectric memory in accordance with the present invention, the third hydrogen barrier layer may preferably have a laminated structure in which a conductive film is sandwiched between two dielectric films. By this, due to the presence of the conductive film, light, electromagnetic wave, charge and the like are prevented from entering the capacitors during the manufacturing process after the third hydrogen barrier layer has been formed, such that the characteristics of the capacitors can be secured.

In the method for manufacturing a ferroelectric memory in accordance with the present invention, a contact hole for connecting to the upper wiring layer to be formed over the lower wiring may preferably have a plane configuration with a dimension in a direction parallel with a plate line smaller than a dimension in a direction orthogonal to the plate line.

By this, the aspect ratio of the contact hole is such that its dimensions in parallel with and orthogonal to the plate line are different from each other. Accordingly, even when the area of the contact hole is made smaller, the greater one of the dimensions (in other words, the smaller one in the aspect ratio) can make the step coverage of the upper wiring layer excellent with respect to the contact hole, and secure connection between the lower wiring and the upper wiring layer. Also, by reducing the dimension in the direction in parallel with the plate line (in other words, the dimension along the capacitors connected by the upper wiring layer), gaps between the capacitors can be made narrower and miniaturization can be achieved.

As a concrete example of a method for manufacturing a ferroelectric memory, a method characterized in conducting the following steps (1)–(20) in this order can be enumerated.

(1) A step of forming a first dielectric film on a semiconductor substrate having a field effect transistor composed of a gate and a source/drain region formed therein;

(2) A step of forming a first contact hole that penetrates the first dielectric film over the source/drain region;

(3) A step of forming a lower contact plug by filling a conductive material in the first contact hole;

(4) A step of forming and then patterning a conductive thin film on the lower contact plug and the first dielectric film, thereby forming a plug connection section that is an electrode for connecting to an upper contact plug on the lower contact plug, and a lower wiring that is a wiring for connecting an upper wiring layer that connects all upper electrodes of a plurality of ferroelectric capacitors to be connected to a common plate line and the plate line at a predetermined position on the first dielectric film;

(5) A step of forming a second dielectric film on the plug connection section, the lower wiring and the first dielectric film, and then planarizing an upper surface of the second dielectric film;

(6) A step of forming a first hydrogen barrier layer on the second dielectric film;

(7) A step of forming a third dielectric film on the first hydrogen barrier layer;

(8) A step of forming a second contact hole that penetrates the second dielectric film, the first hydrogen barrier layer and the third dielectric film over the plug connection section;

(9) A step of forming an upper contact plug by filling a conductive material in the second contact hole;

(10) A step of successively forming a lower electrode thin film, a ferroelectric thin film and an upper electrode thin film on the upper contact plug and the third dielectric film;

(11) A step of forming a ferroelectric capacitor composed of a lower electrode, a ferroelectric layer and an upper electrode on the upper contact plug by patterning the lower electrode thin film, the ferroelectric thin film and the upper electrode thin film;

(12) A step of covering a side surface of the ferroelectric capacitor and an upper surface of the upper electrode with a second hydrogen barrier layer;

(13) A step of forming a fourth dielectric film on the second hydrogen barrier layer and the third dielectric film;

(14) A step of forming a third contact hole that penetrates the fourth dielectric film and the second hydrogen barrier layer over the upper electrode, and forming a fourth contact hole that penetrates the second dielectric film, the first hydrogen barrier layer and the third dielectric film in a portion that becomes to be each of a plurality of ferroelectric capacitors that are to be connected to a common plate line over the lower wiring;

(15) A step of forming the upper wiring layer to connect the upper electrode and a predetermined portion of the lower wiring by forming a conductive film on bottom surfaces and side surfaces of the third and fourth contact holes over the fourth dielectric film and patterning the conductive film;

(16) A step of forming a third hydrogen barrier layer on the upper wiring layer to surround the second hydrogen barrier layer, such that all end sections of the third hydrogen barrier layer contact the first hydrogen barrier layer;

(17) A step of forming a fifth dielectric film on the third hydrogen barrier layer;

(18) A step of forming a fifth contact hole that penetrates the fifth dielectric film, the first hydrogen barrier layer and the second dielectric film at a position below the plate line over the lower wiring;

(19) A step of forming a plate line connection contact plug by filling a conductive material in the fifth contact hole; and (20) A step of forming a plate line on the plate line connection contact plug by forming a conductive thin film on the fifth dielectric film and then patterning the same.

DETAILED DESCRIPTION OF EMBODIMENTS

Embodiments of the present invention are described below.

Figure 1:
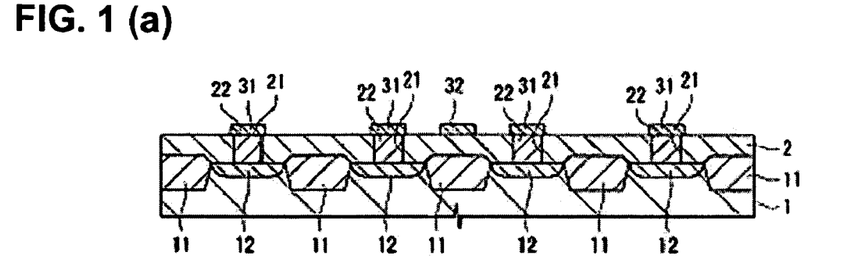
FIG. 1 are cross-sectional views for describing the steps of a "method for manufacturing a ferroelectric memory" in accordance with an embodiment.
Figure 2:
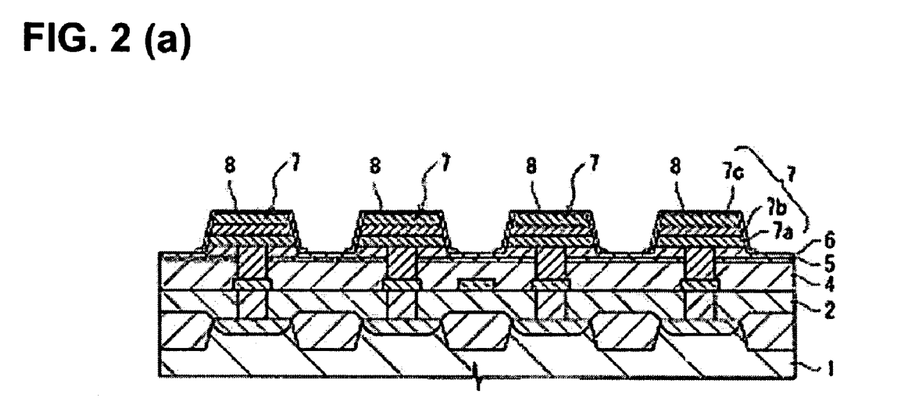
FIG. 2 are cross-sectional views for describing the steps of the "method for manufacturing a ferroelectric memory" in accordance with the embodiment.
Figure 3:
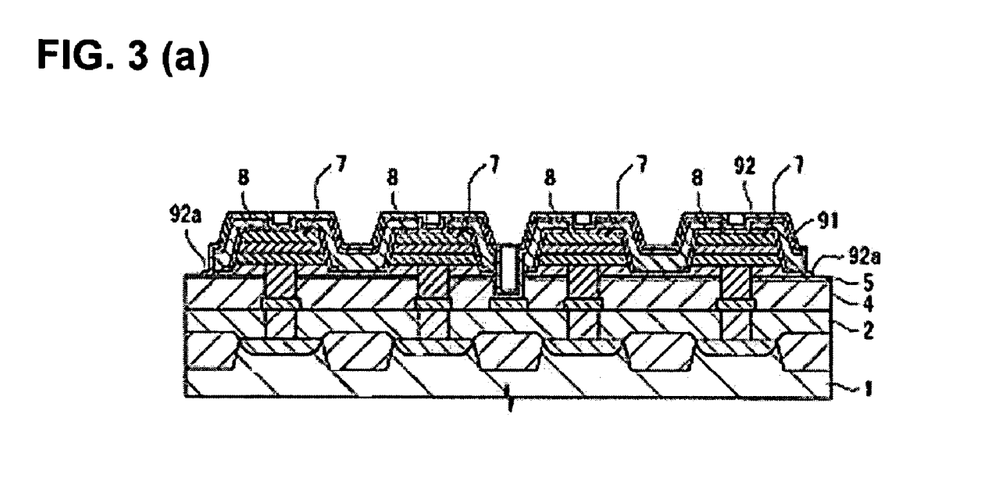
FIG. 3 are cross-sectional views for describing the steps of the "method for manufacturing a ferroelectric memory" in accordance with the embodiment.
Figure 4:
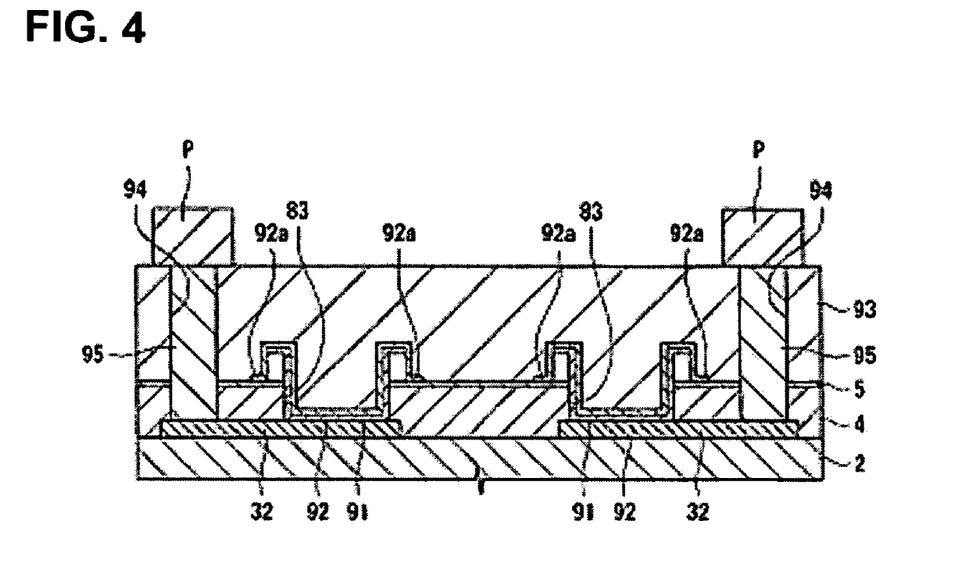
FIG. 4 is a cross-sectional view for describing the steps of the "method for manufacturing a ferroelectric memory" in accordance with the embodiment.
Figure 5:
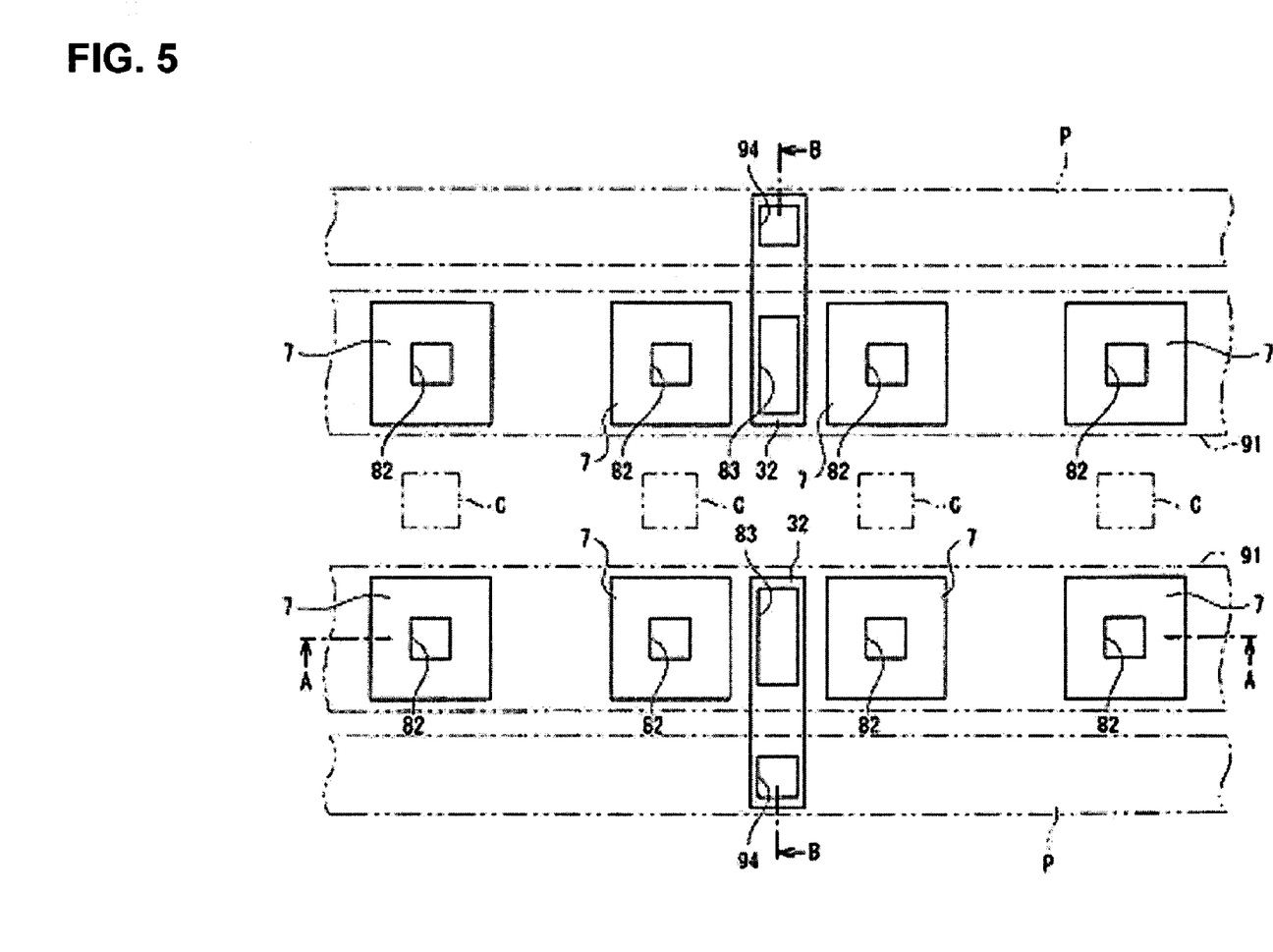
FIG. 5 is a plan view for describing the steps of the "method for manufacturing a ferroelectric memory" in accordance with the embodiment.

FIGS. 1–4 are cross-sectional views for describing the steps in a "method for manufacturing a ferroelectric memory" in accordance with the present embodiment. FIG. 5 is a plan view for describing the steps in the "method for manufacturing a ferroelectric memory" in accordance with the present embodiment. FIGS. 1–3 are views corresponding to an A—A cross section of FIG. 5, which corresponds to a cross-sectional view in parallel with word lines of a memory. FIG. 4 is a view corresponding to a B—B cross section of FIG. 5, which corresponds to a cross-sectional view in parallel with bit lines of the memory (or orthogonal to the word lines and plate lines). Also, signs "C" in FIG. 5 indicate contact holes for connecting source/drain of field effect transistors and bit lines.

First, as shown in FIG. 1(a), a first dielectric film 2 composed of $SiO_2$ is formed on a silicon wafer (semiconductor substrate) with field effect transistors formed thereon. In FIG. 1(a), reference numeral 11 denotes element isolation regions composed of LOCOS films, and reference numeral 12 denotes ones of sources and drain regions. It is noted that gates of the field effect transistors and the other of sources and drain regions are present in cross sections in a direction perpendicular to the surface of FIG. 1.

Next, first contact holes 21 that penetrate the first dielectric film 2 are formed by a photolithography and etching method over the source/drain regions 12, and tungsten plugs are formed inside the first contact holes 21 as lower contact plugs 22.

Then, a conductive thin film is formed over the lower contact plugs 22 and the first dielectric film 2, and this thin film is patterned. Here, as the conductive thin film, a Ti film having a thickness of 15 nm and a TiN film having a thickness of 100 nm are formed in this order. By this, plug connection sections 31 that are electrodes for connecting to upper contact plugs are formed on the lower contact plugs 22, and lower wirings 32 that are electrodes for connecting upper electrodes of ferroelectric capacitors 7 and plate lines P are formed at predetermined positions over the first dielectric film 2 (see also FIG. 4 and FIG. 5). FIG. 1(a) is a view when the steps so far described are completed.

Next, as shown in FIG. 1(b), a second dielectric film 4 is formed over the plug connection sections 31, the lower wirings 32 and the first dielectric film 2, an upper surface of the second dielectric film 4 is planarized, and then a first hydrogen barrier layer 5 is formed on the second dielectric film 4. Here, as the second dielectric film 4, a $SiO_2$ film is formed to a thickness of 500 nm by a plasma CVD method, using a material containing tetraethoxysilane (TEOS) as a main composition. As the first hydrogen barrier layer 5, a SiNx film that is a dielectric film having a hydrogen barrier property is formed to a thickness of 100 nm by a plasma CVD method.

Next, a third dielectric film 6 is formed on the first hydrogen barrier layer 5. Here, as the third dielectric film 6, a $SiO_2$ film is formed to a thickness of 200 nm by a plasma CVD method, using a material containing tetraethoxysilane (TEOS) as a main composition.

Next, second contact holes 61 that penetrate the second dielectric film 4, the first hydrogen barrier layer 5 and the third dielectric film 6 is formed over the plug connection sections 31. Then, by filling a conductive material in the second contact holes 61, upper contact plugs 62 are formed. Here, a Ti film having a thickness of 15 nm and a TiN film having a thickness of 100 nm are formed in this order in the second contact holes 61, a tungsten film of 600 nm is then deposited, and the surface is polished by a CMP method until the third dielectric film 6 is exposed, thereby planarizing the wafer surface. FIG. 1(b) is a view when the steps so far described have been completed.

Next, as shown in FIG. 1(c), a lower electrode thin film 71, a ferroelectric thin film 72 and an upper electrode thin film 73 are formed in this order over the upper contact plugs 62 and the third dielectric film 6. Here, as the lower electrode thin film 71, a TiAlN film having an oxygen barrier property having a thickness of 100 nm and a Pt film having a thickness of 200 nm are formed respectively by a sputtering method. The ferroelectric thin film 72 is formed through forming a PZT film to a thickness of 150 nm by a spin coat method, and conducting a sintering treatment at 700° C. for 15 minutes. As the upper electrode thin film 73, a Pt film is formed to a thickness of 200 nm by a sputtering method.

Next, as shown in FIG. 1(d), the lower electrode thin film 71, the ferroelectric thin film 72 and the upper electrode thin film 73 are patterned by a photolithography and etching method, thereby forming ferroelectric capacitors 7 each composed of a lower electrode 7a, a ferroelectric layer 7b and an upper electrode 7c on each of the upper contact plugs 62.

Next, as shown in FIG. 2(a), side surfaces of the ferroelectric capacitors 7 and upper surfaces of the upper electrodes 7c are covered by a second hydrogen barrier layer 8. The second hydrogen barrier layer 8 is formed through forming, on the wafer in the state shown in FIG. 1(d), an $Al_2O_3$ film that is a dielectric film having a hydrogen barrier property to a thickness of 60 nm by a reactive sputtering method, and then patterning the $Al_2O_3$ film by a photolithography and etching method.

Next, as shown in FIG. 2(b), a fourth dielectric film 81 is formed on the second hydrogen barrier layer 8 and the third dielectric film 6, and then patterned by a photolithography and etching method, thereby forming third contact holes 82 and fourth contact holes 83 (see also FIG. 4 and FIG. 5).

As the fourth dielectric film 81, a $SiO_2$ film is formed to a thickness of 200 nm by a plasma CVD method, using a material containing tetraethoxysilane (TEOS) as a main composition.

The third contact holes 82 penetrate the fourth dielectric film 81 and the second hydrogen barrier layer 8, and reach the upper electrodes 7c. The fourth contact holes 83 penetrate the second dielectric film 4, the first hydrogen barrier layer 5, the third dielectric film 6 and the third dielectric film 81, and reach the lower wiring 32. The fourth contact hole 83 has a plane configuration as shown in FIG. 5, which is a rectangle with a shorter side extending in a direction in parallel with the plate lines P. It is noted that, even when a photomask is rectangular, the plane configuration of the actual fourth contact hole 83 is formed to be an elliptical shape as the corners of the rectangle are rounded.

Next, a conductive thin film is formed over the entire surface of the wafer in the state shown in FIG. 2(b), and then patterned by a photolithography and etching method, thereby forming an upper wiring layer 91. Here, as the conductive thin film, a TiN film is formed to a thickness of 100 nm. FIG. 2(c) shows this state. The upper wiring layer 91 connects all of the upper electrodes 7c of the plural ferroelectric capacitors 7 that are to be connected to each common plate line P to one another, surrounds the second hydrogen barrier layer 8 that covers upper surfaces and side surfaces of the capacitors 7, and connect all of the upper electrodes 7c to the lower wirings 32.

Next, as shown in FIG. 3(a), a third hydrogen barrier layer 92 is formed over the upper wiring layer 91 in a manner that all edge sections 92a (all end sections) thereof are in contact with the first hydrogen barrier layer 5. The third hydrogen barrier layer 92 is formed through forming, over the wafer in the state shown in FIG. 2(c), an $Al_2O_3$ film to a thickness of 60 nm by a reactive sputtering method, and patterning the $Al_2O_3$ film by a photolithography and etching method.

Next, as shown in FIG. 3(b), a fifth dielectric film 93 is formed over the entire wafer surface in this state, and then its upper surface is planarized. As the fifth dielectric film 93, a $SiO_2$ film is formed to a thickness of 1800 nm by a plasma CVD method, using a material containing tetraethoxysilane (TEOS) as a main composition. The planarization of the upper surface was conducted by a CMP method.

Next, as shown in FIG. 4, fifth contact holes 94 that penetrate the fifth dielectric film 93, the first hydrogen barrier layer 5 and the second dielectric film 4 and reach the lower wirings 32 are formed at positions over the lower wirings 32 on the lower side of the plate lines P.

Next, a conductive material is filled in the fifth contact holes 94 to form plate connection contact plugs 95. Here, a Ti film having a thickness of 15 nm and a TiN film having a thickness of 100 nm are formed in this order in the fifth contact holes 94, tungsten is then deposited to a thickness of 600 nm, and the surface is polished by a CMP method until the first dielectric film 93 is exposed, thereby planarizing the wafer upper surface.

Next, a conductive thin film is formed on the fifth dielectric film 93, and is patterned by a photolithography and etching method to thereby form plate lines P on the plate line connection contact plugs 95, respectively. Here, as the conductive thin film, a Ti film having a thickness of 15 nm, a TiN film having a thickness of 100 nm and an Al film having a thickness of 500 nm are formed in this order.

The ferroelectric memory thus obtained is in a state in which the first hydrogen barrier layer 5 is formed below the lower electrodes 7a of the plural ferroelectric capacitors 7, and upper surfaces and side surfaces of the plural ferroelectric capacitors 7 are covered by the second hydrogen barrier layer 8. Also, all of the upper electrodes 7c of the plural ferroelectric capacitors 7 to be connected to each common plate line P are connected to one another by the upper wiring layer 91 that is formed on the second hydrogen barrier layer 8. Also, the third hydrogen barrier layer 92 is formed over the upper wiring layer 91 in a manner to surround the second hydrogen barrier layer 8, and all of the edge sections 92a of the third hydrogen barrier layer 92 are in contact with the first hydrogen barrier layer 5. Also, the upper wiring layer 91 and the plate line P are connected through the lower wiring 32 provided in the dielectric layer 4 on the lower side of the first hydrogen barrier layer 5.

In other words, the ferroelectric memory of the present embodiment is in a state in which the first hydrogen barrier layer 5 protects the ferroelectric capacitors 7 on the side of the lower electrodes 7a, the second hydrogen barrier layer 8 protects the side surfaces of the ferroelectric capacitors 7, and the second hydrogen barrier layer 8 and the third hydrogen barrier layer 92 protect the ferroelectric capacitors 7 on the side of the upper electrodes 7c. Also, all of the edge sections 92a of the third hydrogen barrier layer 92 are in contact with the first hydrogen barrier layer 5, such that the side surfaces of the ferroelectric capacitors 7 are doubly protected. Accordingly, by the ferroelectric memory of the present embodiment, hydrogen is securely prevented from being introduced in the ferroelectric layers 7 of the ferroelectric capacitors 7.

According to the method of the present embodiment, all of the upper electrodes 7c of the plural ferroelectric capacitors 7 to be connected to each common plate line P are connected to one another by the upper wiring layer 91, and the upper wiring layer 91 is connected to the plate line P through the lower wiring 32 provided below the ferroelectric capacitors 7. For this reason, the upper electrodes 7c would not be exposed, and would not contact a hydrogen atmosphere. In other words, the step of forming tungsten plugs on the upper electrodes 7c of the ferroelectric capacitors 7 becomes unnecessary, such that hydrogen is securely prevented from entering the ferroelectric layers 7b of the ferroelectric capacitors 7. Also, according to the method of the present embodiment, the fourth contact hole 83 has a plane configuration which is a rectangle with a shorter side extending in a direction in parallel with the plate lines P. Accordingly, even when the area of the fourth contact hole 83 is made smaller, the step coverage of the upper wiring layer 91 can be made excellent along the longer side of the rectangle, and connection between the lower wiring 32 and the upper wiring layer 91 can be made secure. Also, by reducing the dimension in the direction in parallel with the plate lines P (in other words, the dimension along the capacitors connected by the upper wiring layer 91), gaps between the capacitors can be made narrower.

Also, according to the method of the present embodiment, the contact plug that directly connects the lower electrode 7a and the source/drain region 12 is formed in a two-stage structure in which the lower contact plug 22 and the upper contact plug 62 are connected through the plug connection section 31. For this reason, compared to the method of forming a deep contact hole in a single stage, a ferroelectric memory can be readily manufactured. Also, because the plug connection section 31 is inserted between the lower contact plug 22 and the upper contact plug 62, positional alignment of the two plugs can be readily made.

It is noted that, in accordance with the present embodiment, a single dielectric layer of $Al_2O_3$ is formed as the third hydrogen barrier layer 92. However, the third hydrogen barrier layer may be provided with a laminated structure in which a conductive film is placed between two dielectric film layers. By providing the third hydrogen barrier layer with such a laminated structure, light, electromagnetic wave, charge and the like are shielded by the conductive film during the manufacturing process after the third hydrogen barrier layer has been formed, such that deterioration of the characteristics of the ferroelectric capacitors can be prevented. It is noted that, as the conductive film composing the third hydrogen barrier layer with a laminated structure, a TiAlN film, a TiAl film, a TiN film and the like can be enumerated.

What is claimed is:

1. A stacked type ferroelectric memory having a plurality of ferroelectric capacitors and transistors connected thereto, wherein lower electrodes of the ferroelectric capacitors and source/drain regions of the corresponding transistors are directly connected by contact plugs, respectively, the ferroelectric memory characterized in that:

a first hydrogen barrier layer is formed below the lower electrodes of the plurality of ferroelectric capacitors, and a second hydrogen barrier layer covers upper surfaces and side surfaces of the plurality of ferroelectric capacitors;

all upper electrodes of a plurality of the ferroelectric capacitors connected to a common plate line are connected by an upper wiring layer formed above the second hydrogen barrier layer;

a third hydrogen barrier layer is formed on the upper wiring layer to surround the second hydrogen barrier layer;

all end sections of the third hydrogen barrier layer contact the first hydrogen barrier layer; and the upper wiring layer and the plate line are connected through a lower wiring provided at a dielectric layer on a lower side of the first hydrogen barrier layer.

2. A method for manufacturing a stacked type ferroelectric memory having a plurality of ferroelectric capacitors and transistors connected thereto, wherein lower electrodes of the ferroelectric capacitors and source/drain regions of the corresponding transistors are directly connected by contact plug, respectively, the method for manufacturing a ferroelectric memory characterized in comprising:

a step of forming a first hydrogen barrier layer at a position on a lower side of lower electrodes of the plurality of ferroelectric capacitors;

a step of laminating and then patterning a lower electrode thin film, a ferroelectric thin film and an upper electrode thin film, thereby forming ferroelectric capacitors formed from lower electrodes, ferroelectric layers and upper electrodes on the contact plugs, respectively;

a step of covering upper surfaces and side surfaces of the plurality of ferroelectric capacitors formed in the previous step with a second hydrogen barrier layer;

a step of forming a lower wiring for connecting an upper electrode layer that connects all upper electrodes of a plurality of the ferroelectric capacitors to be connected to a common plate line and the plate line at a dielectric layer formed at a position on a lower side of the first hydrogen barrier layer;

a step of forming the upper wiring layer to be connected to the upper electrodes and predetermined portions of the lower wiring on the second hydrogen barrier layer;

a step of forming a third hydrogen barrier layer on the upper wiring layer to surround the second hydrogen barrier layer, and to bring all ends of the third hydrogen barrier layer to be in contact with the first hydrogen barrier layer; and a step of forming the plate line on the contact plugs.

3. A method for manufacturing a ferroelectric memory according to claim 2, wherein the third hydrogen barrier layer has a laminated structure in which a conductive film is sandwiched between two dielectric films.

4. A method for manufacturing a ferroelectric memory according to claim 2, wherein a contact hole for connecting to the upper wiring layer to be formed over the lower wiring has a plane configuration with a dimension in a direction in parallel with the plate line smaller than a dimension in a direction orthogonal to the plate line.

5. A method for manufacturing a ferroelectric memory characterized in conducting in an order as follows:

a step of forming a first dielectric film on a semiconductor substrate having a field effect transistor composed of a gate and a source/drain region formed therein;

a step of forming a first contact hole that penetrates the first dielectric film over the source/drain region;

a step of forming a lower contact plug by filling a conductive material in the first contact hole;

a step of forming and then patterning a conductive thin film on the lower contact plug and the first dielectric film, thereby forming a plug connection section that is an electrode for connecting to an upper contact plug on the lower contact plug, and a lower wiring that is a wiring for connecting an upper wiring layer that connects all upper electrodes of a plurality of ferroelectric capacitors to be connected to a common plate line and the plate line at a predetermined position on the first dielectric film;

a step of forming a second dielectric film on the plug connection section, the lower wiring and the first dielectric film, and then planarizing an upper surface of the second dielectric film;

a step of forming a first hydrogen barrier layer on the second dielectric film;

a step of forming a third dielectric film on the first hydrogen barrier layer;

a step of forming a second contact hole that penetrates the second dielectric film, the first hydrogen barrier layer and the third dielectric film over the plug connection section;

a step of forming an upper contact plug by filling a conductive material in the second contact hole;

a step of successively forming a lower electrode thin film, a ferroelectric thin film and an upper electrode thin film on the upper contact plug and the third dielectric film;

a step of forming a ferroelectric capacitor composed of a lower electrode, a ferroelectric layer and an upper electrode on the upper contact plug by patterning the lower electrode thin film, the ferroelectric thin film and the upper electrode thin film;

a step of covering a side surface of the ferroelectric capacitor and an upper surface of the upper electrode with a second hydrogen barrier layer;

a step of forming a fourth dielectric film on the second hydrogen barrier layer and the third dielectric film;

a step of forming a third contact hole that penetrates the fourth dielectric film and the second hydrogen barrier layer over the upper electrode, and forming a fourth contact hole that penetrates the second dielectric film, the first hydrogen barrier layer and the third dielectric film in a portion between each of a plurality of ferroelectric capacitors that are to be connected to a common plate line over the lower wiring;

a step of forming the upper wiring layer to connect the upper electrode and a predetermined portion of the lower wiring by forming a conductive film on bottom surfaces and side surfaces of the third and fourth contact holes over the fourth dielectric film and patterning the conductive film;

a step of forming a third hydrogen barrier layer on the upper wiring layer to surround the second hydrogen barrier layer, such that all end sections of the third hydrogen barrier layer contact the first hydrogen barrier layer;

a step of forming a fifth dielectric film on the third hydrogen barrier layer;

a step of forming a fifth contact hole that penetrates the fifth dielectric film, the first hydrogen barrier layer and the second dielectric film at a position below the plate line over the lower wiring;

a step of forming a plate line connection contact plug by filling a conductive material in the fifth contact hole; and a step of forming a plate line on the plate line connection contact plug by forming and then patterning a conductive thin film on the fifth dielectric film.

* * * * *